(12) United States Patent
Fiorini et al.

(10) Patent No.: US 7,075,081 B2
(45) Date of Patent: Jul. 11, 2006

(54) METHOD OF FABRICATION OF AN INFRARED RADIATION DETECTOR AND INFRARED DETECTOR DEVICE

(75) Inventors: Paolo Fiorini, Brussels (BE); Sherif Sedky, Dokki Giza (EG); Matty Caymax, Leuven (BE); Christiaan Baert, Heverlee (BE)

(73) Assignee: Interuniversitair Microelektronica Centrum (IMEC vzw), Leuven (BE)

( * ) Notice: Subject to any disclaimer, the term of this patent is extended or adjusted under 35 U.S.C. 154(b) by 0 days.

(21) Appl. No.: 10/921,012

(22) Filed: Aug. 17, 2004

(65) Prior Publication Data

US 2005/0012040 A1  Jan. 20, 2005

Related U.S. Application Data

(60) Division of application No. 09/861,334, filed on May 18, 2001, which is a continuation of application No. 09/702,501, filed on Oct. 31, 2000, now Pat. No. 6,274,462, which is a continuation of application No. 09/049,797, filed on Mar. 27, 1998, now Pat. No. 6,194,722.

(30) Foreign Application Priority Data

Mar. 28, 1997  (EP) ................................. 97870044

(51) Int. Cl.
*C23C 16/00* (2006.01)

(52) U.S. Cl. ................................. 250/338.4; 250/338.1
(58) Field of Classification Search ............ 250/338.4, 250/338.1, 332, 495.1; 438/106, 117, 758, 438/767; 257/415, 414, 616, 734, 735
See application file for complete search history.

(56) References Cited

U.S. PATENT DOCUMENTS

| 4,239,312 A | 12/1980 | Myer et al. .................... 339/17 |
| 4,902,894 A | 2/1990 | Butler et al. ............. 250/338.1 |
| 5,010,251 A | 4/1991 | Grinberg et al. |
| 5,021,663 A | 6/1991 | Hornbeck |
| 5,119,328 A | 6/1992 | Matsumoto et al. .......... 365/10 |
| 5,220,188 A | 6/1993 | Higashi et al. |
| 5,220,189 A | 6/1993 | Higashi et al. |
| 5,241,193 A | 8/1993 | Pfiester et al. ................ 257/57 |
| 5,286,976 A | 2/1994 | Cole |
| 5,291,055 A | 3/1994 | Farhoomand et al. ....... 257/437 |

(Continued)

FOREIGN PATENT DOCUMENTS

EP    866701    9/1998

(Continued)

OTHER PUBLICATIONS

Wolf and Tauber, Silicon *Processing for the VLSI Era*, vol. 1: Process Technology, pp. 168-173, Lattice Press 1986, Sunset Beach, California.

(Continued)

*Primary Examiner*—Otilia Gabor
(74) *Attorney, Agent, or Firm*—McDonnell Boehnen Hulbert & Berghoff LLP

(57) ABSTRACT

A method of controlling an internal stress in a polycrystalline silicon-germanium layer deposited on a substrate. The method includes selecting a deposition pressure that is at or below atmospheric pressure and selecting a deposition temperature that is no greater than 700° C. The deposition pressure and the deposition temperature are selected so as to achieve an internal stress in the silicon-germanium layer that is within a predetermined range.

20 Claims, 13 Drawing Sheets

U.S. PATENT DOCUMENTS

| | | | |
|---|---|---|---|
| 5,300,915 A | 4/1994 | Higashi et al. | 338/22 R |
| 5,357,803 A * | 10/1994 | Lane | 73/514.18 |
| 5,367,167 A | 11/1994 | Keenan | |
| 5,369,280 A | 11/1994 | Liddiard | |
| 5,371,035 A * | 12/1994 | Pfiester et al. | 438/439 |
| 5,399,897 A | 3/1995 | Cunningham et al. | |
| 5,426,070 A * | 6/1995 | Shaw et al. | 216/2 |
| 5,805,971 A * | 9/1998 | Akedo | 419/6 |
| 5,846,849 A * | 12/1998 | Shaw et al. | 438/52 |
| 5,847,454 A * | 12/1998 | Shaw et al. | 257/734 |
| 5,883,564 A | 3/1999 | Partin | 338/32 R |
| 6,017,779 A | 1/2000 | Miyasaka | |
| 6,064,081 A * | 5/2000 | Robinson et al. | 257/183 |
| 6,194,722 B1 | 2/2001 | Fiorini et al. | 250/338.1 |
| 6,210,988 B1 * | 4/2001 | Howe et al. | 438/50 |
| 6,211,560 B1 | 4/2001 | Jimenez et al. | 257/451 |
| 6,238,581 B1 | 5/2001 | Hawkins et al. | 216/13 |
| 6,274,462 B1 | 8/2001 | Fiorini et al. | 438/478 |
| 6,346,453 B1 * | 2/2002 | Kovacic et al. | 438/312 |
| 6,448,622 B1 * | 9/2002 | Franke et al. | 257/415 |
| 6,478,974 B1 | 11/2002 | Lebouitz et al. | 216/2 |
| 6,534,381 B1 | 3/2003 | Cheung et al. | 438/455 |
| 6,559,021 B1 * | 5/2003 | Houghton et al. | 438/312 |
| 6,587,613 B1 * | 7/2003 | De Natale | 385/18 |
| 6,666,979 B1 * | 12/2003 | Chinn et al. | 216/2 |
| 6,689,211 B1 * | 2/2004 | Wu et al. | 117/94 |
| 6,707,121 B1 * | 3/2004 | De Moor et al. | 257/420 |
| 6,770,569 B1 * | 8/2004 | Foerstner et al. | 438/758 |
| 6,794,275 B1 * | 9/2004 | Kondo et al. | 438/485 |
| 6,822,304 B1 * | 11/2004 | Honer | 257/418 |
| 6,875,671 B1 * | 4/2005 | Faris | 438/455 |

FOREIGN PATENT DOCUMENTS

| | | |
|---|---|---|
| EP | 1251099 A2 * | 10/2002 |
| FR | 2765245 | 6/1997 |
| WO | WO9116607 | 10/1991 |
| WO | WO9313561 | 7/1993 |
| WO | WO9326050 | 12/1993 |
| WO | WO 01/74708 A2 * | 10/2001 |

OTHER PUBLICATIONS

Franke et al., *Post-CMOS Integration of Germanium Microstructures*, University of California at Berkeley, IEEE, pp. 630-637, 1999.

King et al., *Deposition and Properties of Low-Pressure Chemical-Vapor Deposited Polycrystalline Silicon-Germanium Films*, Journal of the Electrochemical Society, vol. 141, No. 8, pp. 2235-2241, 1994.

Published European Search Report for Interuniversitair Micro-Elektronica Centrum, EP 02 07 7978, dated Oct. 9, 2003.

Tsu-Jae King et al., *Deposition and Properties of Low-Pressure Chemical-Vapor Deposited Polycrystalline Silicon-Germanium Films*, Journal of the Electrochemical Society, Electrochemical Society, Manchester, New Hampshire, U.S., vol. 141, No. 8, pp. 2235-2241, Aug. 1, 1994.

Tsu-Jae King et al., *Polycrystalline Silicon-Germanium Thin-Film Transistors*, IEEE Transactions on Electron Devices, IEEE Inc., New York, NY U.S., vol. 41, No. 9, pp. 1581-1591, Sep. 1, 1994.

Syun-Ming Jang et al., *Thermal Stability of Si/$i_{1-x}$Ge$_x$/Si Hetrostructures Deposited By Very Low Pressure Chemical Vapor Deposition*, Applied Physics Letters, American Institute of Physics, New Your, U.S., vol. 61, No. 3, pp. 315-317, Jul. 20, 1992.

Huang et al., *Low-temperature epitaxy of phosphorus doped Di and Si/sub 1-x/Ge/sub x/films by RTP/VLP-CVD*, pp. 465-467, Conference on Solid-State and Integrated Circuit Technology, Beijing, China, Oct. 24-28, 1995.

Theresa A. Core et al., *Fabrication Technology for an Integrated Surface-Micromachine Sensor*, Solid State Technology, pp. 39-44, Oct. 1993.

P. Van Gerwen et al., *Thin Film Boron Doped Polycrystalline Silicon$_{70\%}$-Germanium$_{30\%}$ for Thermopiles*, Transducers 95: Eurosensors IX, The 8$^{th}$ International Conference on Solid-State Sensors and Actuators and Eurosensors, Stockholm, Sweden, pp. 210-213, Jun. 25-29, 1995.

P. Van Gerwen et al., *Thin-film boron-doped polycrystalline silicon$_{70\%}$ -germanium$_{30\%}$ for thermopiles*, 0924-4247/96/S1500@1996 Elseveier Sciences, S.A.

Syun-Ming Jang et al., *Therman Stability of Si/Si$_{1-x}$Ge$_x$/Si heterostructures deposited by very low pressure chemical vapor disposition*, App. Phys. Lett., vol. 61, No. 3, Jul. 20, 1992.

Tsu-Jae King and Krishna C. Saraswat, *Deposition and Properties of Low-Pressure Chemical Vapor Deposited Polycrystalline Silicon-Germanium Films*, J. Electrochem Co., vol. 141, No. 8, Aug. 1994.

D. Maier-Schneider et al., *Variations in Young's modulus and intrinsic stress of LPCVD-polysilicon due to high temperature annealing*, J. Micromech, Microeng. 5 pp. 121-124, 1995.

Sherif Sedky et al., *Thermally Insulated Structures for IR Bolometers, Made of Polycrystalline Silicon Germanium Alloys-...*, Transducers '97, 1997 International Conference on Solid-State Sensors and Actuators, Chicago, Jun. 16-19, 1997.

P. Steiner et al., *Micromachining applications of porous silicon*, Elsevier Science, Thin Sold Films, 255, pp. 52-58, 1995.

Akio Tanaka et al., *Infrared Focal Plan Array Incorporating Silicon IC Process Compatible Bolometer*, IEEE Transactions on Electron Devices, vol. 43, No. 11, pp. 1844-1850, Nov. 1996.

M. H. Unewisse et al., *The Growth and Properties of Semiconductor Bolometers for Infrared Detection*, SPIE vol. 2554 Growth and Characterization of Materials for Infrared Detectors, pp. 43-54, Jul. 1995.

R. A. Wood, *Uncooled thermal imaging with monolithic silicon focal planes*, SPIE vol. 202 Infrared Technology XIX, pp. 322-329, 1993.

*Uncooled infrared focal-....*, Laser Focus World, Dec. 1995.

* cited by examiner

SIDE VIEW

TOP VIEW

SIDE VIEW

TOP VIEW

SIDE VIEW

TOP VIEW

SIDE VIEW

TOP VIEW

SIDE VIEW

TOP VIEW

SIDE VIEW

TOP VIEW

25 × 25 μm Pixels

50 × 50 μm Pixels

METHOD OF FABRICATION OF AN INFRARED RADIATION DETECTOR AND INFRARED DETECTOR DEVICE

CROSS REFERENCE TO RELATED APPLICATIONS

This is a divisional application of U.S. patent application Ser. No. 09/861,334, filed on May 18, 2001, which is a continuation of U.S. patent application Ser. No. 09/702,501, filed on Oct. 31, 2000 now U.S. Pat. No. 6,274,462, which is a continuation of Ser. No. 09/049,797, filed on Mar. 27, 1998 now U.S. Pat. No. 6,194,722. U.S. application Ser. No. 09/049,797 claims priority benefits to European Patent Application 97870044.1 filed on Mar. 28, 1997. The entire disclosures of U.S application Ser. No. 09/861,334, U.S. application Ser. No. 09/702,501, U.S. application Ser. No. 09/049,797 and European Application 97870044.1 are incorporated by reference herein in their entirety.

OBJECT OF THE INVENTION

The present invention is related to a method of fabrication for an infrared radiation detector, and more particularly an infrared sensitive bolometer, using micro-machining techniques.

The present invention is also related to the infrared detector itself.

Finally, the present invention is related to a specific use of surface micro-machining techniques.

BACKGROUND OF THE INVENTION

A large number of infrared detection methods exist, each being based on a different working principal. Infrared detectors are being used in a large number of applications.

The present invention focuses on the group of detectors where the energy of the absorbed infrared radiation raises the temperature of the detecting element thereby changing its electrical conductivity. These detectors, known as bolometers, are fabricated from different materials like metals, permalloy, vanadium oxide, or (poly-crystalline) silicon.

In order to obtain a high performance, two points are important:
1) the total thermal conductance G from the resistor to the substrate must be low, so as to maximise the temperature increase for a given amount of energy deposited on the detector; and
2) the absolute value of the temperature coefficient of resistance (TCR) α (i.e., the percent variation of the device resistance for a temperature increase of 1 K) must be large.

The first point is related to the geometrical structure of the detector and to the thermal properties of the material(s) forming it, and the second one is related only to the electrical properties of the active material.

With technologies suggested in the state of the art of micro-machining good thermal insulation is obtained in two different ways either by micro-machining an electrically and thermally insulating membrane and depositing the active material onto it, either by micro-machining structures suspended over the substrate directly using the active material. This last approach is more simple and straightforward but requires an active material with low thermal conductance and with mechanical properties adequate for micro-machining. Until now, this is applied only to poly-crystalline silicon (poly-Si) bolometers.

An example of the first approach is reported in document WO-A-9313561 which describes a method for fabricating an integrated infrared sensitive bolometer having a polycrystalline element whereby an oxide region deposited on silicon nitride covered with a first polysilicon layer which is etched to provide a location for a bolometer element. A second polysilicon layer is deposited and doped to achieve a desired temperature coefficient of resistivity of 1 to 2%/° C. The second polysilicon layer forms an infrared sensitive element over the oxide region. Openings are etched in the infrared sensitive element to permit an etchant to remove the oxide region resulting in the sensitive element being suspended over the cavity. The thermal conductance is determined by the thermal conductivity of poly-Si and by the shape of the etch of the first poly-Si layer.

An example of the second approach is described in the document "Infrared Focal Plane Array Incorporating Silicon IC Process Compatible Bolometer" of Tanaka, et al. published in IEEE Transactions on Electron Devices, Vol. 43, No. 11, November 1996 which describes a 128×128 element bolometer infrared image sensor using thin film titanium. The device is a monolithically integrated structure with a titanium bolometer detector located over a CMOS circuit that reads out the bolometer's signals. By employing a metallic material like titanium and refining the CMOS readout circuit, it is possible to minimize 1/f noise. Since the fabrication process is silicon-process compatible, costs can be kept low.

The article "The Growth and Properties of Semiconductor Bolometers for Infrared Detection" of M. H. Uniwisse, et al in SPIE Vol. 2554/43 describes how to develop bolometer arrays from semiconductor materials, such as the amorphous and microcrystalline phases of Si, Ge, and SiGe. In this work, the use of amorphous and microcrystalline SiGe:H is suggested in order to reduce the large 1/f noise and the large resistivity of amorphous silicon. No use of the thermal properties of SiGe is mentioned.

The article "Thin Film Boron Doped Polycrystalline Silicon Germanium for the Thermopiles" of P. Van Gerwen, et al. in the 8$^{th}$ International Conference on Solid-State Sensors and Actuators, and Eurosensors IX, Stockholm, Sweden, Jun. 25–29, 1995 describes the use of polycrystalline silicon-germanium for thermopiles instead of polysilicon. Thermopiles can be used for infrared detection if incident infrared is absorbed by an absorption layer near one junction which will heat up. The other junction is put on a heat sink, which will not heat. The temperature difference between the two junctions creates a voltage related to the absorbed infrared. These thermopiles are fabricated according to bulk micro-machining techniques.

Double-sided processing and special handling requirements though make bulk micro-machining incompatible with standard IC fabrication techniques.

U.S. Pat. No. 5,367,167 is describing a bolometer for detecting radiation in a spectral range including an integrated circuit substrate and a pixel body spaced from the substrate. The pixel body comprises an absorber material such as titanium for absorbing radiation in the spectral range. In addition, a variable resistor material which is the active element made of amorphous silicon is formed over an insulating layer.

The article "Thermal stability of Si/Si$_{1-x}$Ge$_x$/Si heterostructures deposited by very low pressure chemical vapor deposition" published in Applied Physics Letter, vol. 61, No. 3, of 20 Jul. 1992, pp; 315–316 describes structures using crystalline SiGe deposited on crystalline Si. More particularly, this document is related to the study of the thermal stability of metastable Si/Si$_{1-x}$Ge$_x$/Si strained structures deposited by very low pressure chemical vapor deposition.

OBJECTS OF THE INVENTION

The first object of the present invention is to provide a method of fabricating an infrared radiation detector, and more particularly an infrared sensitive bolometer, having improved thermal insulation.

A second object of the present invention is to suggest a method of fabricating a bolometer which can be arranged in arrays of pixels for applications such as (night) cameras, for instance.

A third object of the present invention is to disclose the fabrication of an infrared radiation detector with a material having lower thermal conductance compared to state of the art detectors but still compatible with standard IC technologies and having electrical and mechanical properties which are at least similar to those of the state of the art.

SUMMARY OF THE PRESENT INVENTION

As a first aspect, the present invention is related to a method of fabricating an infrared sensitive bolometer comprising the steps:
forming a sacrificial layer on a substrate;
patterning said sacrificial layer
establishing, through depositing or growing, an active layer made of polycrystalline SiGe on said sacrificial layer;
depositing an infrared absorber on said polycrystalline SiGe layer;
removing the sacrificial layer.

Preferably, the method further comprises, after establishing an active layer, through depositing or growing, the steps of:
patterning said polycrystalline SiGe layer, thereby forming an active area and supports of the detector;
performing a high doping of the supports and a moderate doping of the active area;
depositing an infrared absorber on said polycrystalline SiGe layer.

In this way, a poly-SiGe resistor thermally insulated from the substrate will be formed. Infrared radiation will generate an increase of temperature which will in turn originate a decrease in resistance.

The sacrificial layer can be defined as a layer used only in order to realize the purpose of thermal insulation of the bolometer. In fact, the bolometer should be thermally insulated, otherwise, its temperature will be no longer controlled by the incident radiation. Thus, the structure is built on the top of the sacrificial layer and is connected to the substrate through the supports. After removing the sacrificial layer, the supports will be the thermal path between the device and the substrate. Hence, the thermal conductance of the supports play an important role in insulating the device and therefore should be minimized.

The active area can be understood as the area of the bolometer, which works as a detector portion.

Patterning should be understood as forming structures on/in different layers on/in the substrate according to the techniques known in the microelectronics and micromachining such as photolithography.

Preferably, the step of patterning said sacrificial layer comprises the steps of defining anchor points.

Furthermore, the method of fabrication according to the present invention can also include the step of depositing one or more intermediate layer(s) in said substrate prior to depositing said sacrificial layer and wherein the intermediate layer(s) comprise at least an etch stop layer.

Preferably, the substrate is a Si substrate and the active layer is made of polycrystalline Si$_{70\%}$Ge$_{30\%}$.

According to one preferred embodiment, the regions having the sacrificial layer can be formed with a porous silicon region.

According to another preferred embodiment, these regions having the sacrificial layer can be created by depositing and patterning an insulating layer made of an oxide.

The steps of high doping of the supports and moderate doping of the active area can be achieved by means ion implantation.

The polycrystalline SiGe layer is preferably deposited by chemical vapour deposition at atmospheric pressure or at a reduced pressure.

The infrared absorber can be created according to a first preferred embodiment with a stack of layers comprising a metallic layer, an insulating layer and a semi-transparent metallic layer. According to a second embodiment, the infrared absorber only comprises a metallic layer and an insulator of appropriate thickness.

According to a third preferred embodiment, the infrared absorber comprises at least a semitransparent metallic layer As a second aspect, the present invention is related to a method of controlling stress in a polycrystalline SiGe layer deposited on a substrate such as a silicon oxide substrate by varying the deposition pressure and/or the annealing temperature.

As a third aspect, the present invention is related to an infrared sensitive bolometer comprising an active area and an infrared absorber, wherein said active area comprises a polycrystalline SiGe layer, and is suspended above a substrate.

BRIEF DESCRIPTION OF THE DRAWINGS

FIGS. 1a and 1b represent the cross-section of two possible embodiments of structures for a bolometer achieved by the method of the present invention while

DETAILED DESCRIPTION OF THE PRESENTLY PREFERRED EMBODIMENTS

In an aspect of the present invention, a method of fabricating an infrared bolometer is described, which has an improved thermal insulation behaviour. Furthermore, a bolometer fabricated according to the method of the invention is described.

In order to evaluate a material for the realisation of a bolometer, it is necessary to understand how its properties influence the responsivity and the noise of the bolometer itself.

According to the invention, use is made of an alloy comprising polycrystalline Silicon Germanium (poly-SiGe).

This material has lower thermal conductance than polycrystalline silicon, and is compatible with the standard IC technology. It also has electrical and mechanical properties which are superior to those of polycrystalline silicon.

Figure 1A:
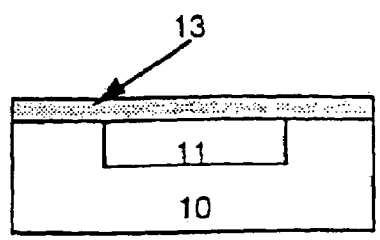
Figure 1B:
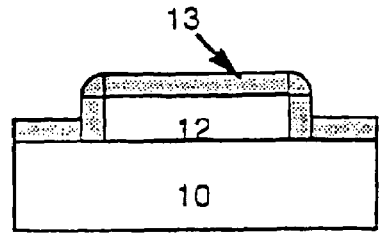
Figure 1C:
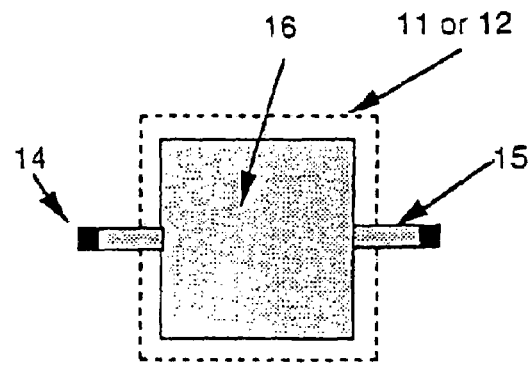
FIG. 1c represents the top view of both embodiments shown in FIGS. 1a and 1b.

Several possible structures of bolometers are shown in the FIGS. 1a, 1b, and 1c.

FIG. 1a represents a bolometer wherein porous silicon regions 11 have been formed on a substrate 10, while FIG. 1b represents the deposition and the patterning of an insulating layer 12 on a substrate 10. In both cases, a polycrystalline SiGe layer 13 is then established, by depositing and patterning, in order to form the active area 16 and the supports 15 connected to the substrate at the anchor points 14 as represented in FIG. 1c.

The particular shape of FIG. 1c has to be considered only as an example and that the present invention is not limited to this particular shape, but covers all similar structures, characterised by long and thin supports.

For the purpose of teaching of the invention, an important application of bolometers of the invention is described below. One of the most important applications of the bolometers is the realisation of an infrared camera. Said camera is an array of pixels, each containing a bolometer and some electronics.

Figure 2:
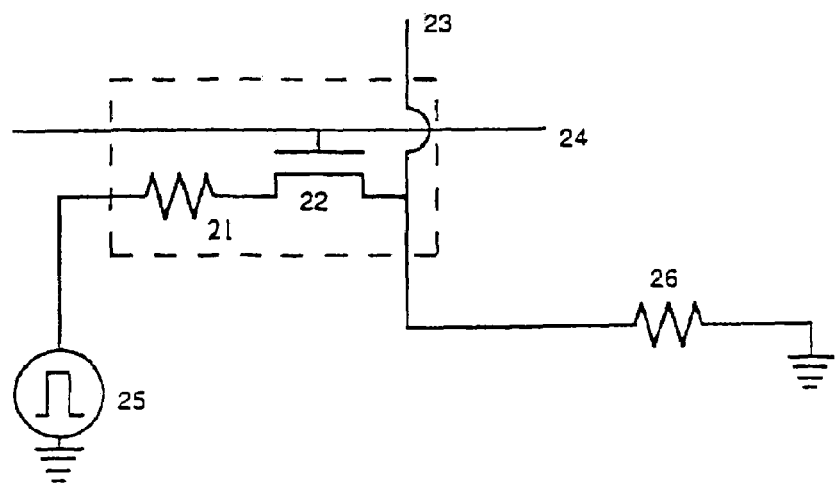
FIG. 2 shows a schematic representation of a pixel and its external electronics of a camera according to one embodiment of the invention.

A schematic view of a pixel is shown in FIG. 2. The bolometer is represented by the reference 21, and is connected to a CMOS switch 22, built in the substrate, while the signal and gate lines 23 and 24 go to the external read-out. Externally to the array, a voltage waveform generator 25 and a load resistor 26 are provided. During calibration, the CMOS switch 22 is closed, a short voltage pulse is sent to the bolometer, and the voltage drop across the load resistance is measured. This operation is repeated in presence of infrared radiation. A signal is defined as the difference of the voltage across the load resistor measured with and without infrared radiation. Note that in a normal operation, the duration of the voltage pulse is shorter than the thermal time constant of the bolometer, and does not create a temperature increase.

The volt responsivity ℜ, i.e. the signal per unit incident power of a bolometer is given by:

$$\Re = \frac{|\alpha|\eta V R_L R_B}{(R_L + R_B)^2 G}$$

where $R_L$ and $R_B$ are the load resistance and bolometer resistance, respectively.

G is the thermal conductance of the supports towards the substrate. It depends mainly on the thermal conductivity of the material and the geometry of the supports.

An appropriate expression of the thermal conductance (for long supports) is $$G = g\frac{wt}{l}$$

where the w, t and l are the width, the thickness, and the length of the supports respectively. It is clear from the above expression that the thermal conductance can be minimized by using thin and long supports.

It is also evident that in order to obtain a large responsivity, the applied voltage V, the absolute value of the temperature coefficient of resistance α and the infrared emissivity η must be large, while the total thermal conductance toward the support, G, must be minimised.

The noise which affects this responsivity signal has two contributions: external (from read-out electronics, load resistor, amplifiers . . . ) and internal (due to the bolometer itself). External noise can be reduced by design optimisation and is, to a large extent, independent of the bolometer characteristics. Concerning the bolometer noise, the relevant quantity is not the noise itself but the noise equivalent power (NEP), i.e. the power which generates a signal equal to the noise.

Three contributions should be considered to the noise equivalent power: the Johnson noise, the temperature fluctuation noise and the low frequency noise typical of the active material.

For the case of Johnson noise, it can be defined as:

$$NEP_J = \frac{\sqrt{4KTR_B}}{\Re}\Delta f_e$$

It can be minimised by reducing the bandwidth $\Delta f_e$ with appropriate actions on the electronics or by using a low value for the bolometer resistance.

For the case of thermal fluctuation noise, it can be defined as: $NEP_{th} = \sqrt{4kGT^2}\Delta f_t$ wherein $\Delta f_t$ is a thermal bandwidth of the order of the inverse of the thermal time constant of the bolometer.

The 1/f noise is given by $$V_{n,1/f} = kV_b\sqrt{\frac{\rho}{WLTf}}$$

wherein the coefficient k depends of the microcrystalline structure of the material, $V_b$ is the voltage across the terminals of the bolometer, ρ is the resistivity, W, L and T are the width, length and thickness of the pixel respectively. It should be noted that also this contribution to the noise is, as the Johnson one, minimized by using low values of the bolometer resistance. Furthermore, the 1/f noise increases proportionally with the baising voltage which is not the case for the Johnson noise.

It is evident that the conditions which maximise the responsivity also minimise the NEP. In particular, as far as the material properties are concerned, one needs low G and large |α|. These properties for the poly-SiGe used in the present invention will be discussed further.

Meanwhile, the influence of 1/f noise will be discussed together with the responsivity results.

Thermal Conductance and Stress Properties of the Material used in the Bolometer of the Invention The possibility of realising a good thermal insulation depends on the geometry of the structure and on the thermal conductance of the material. It is known that in order to realise micro-machined structures similar to that of FIG. 1 it is important to use films with low, and possibly tensile, internal stress.

Figure 3:
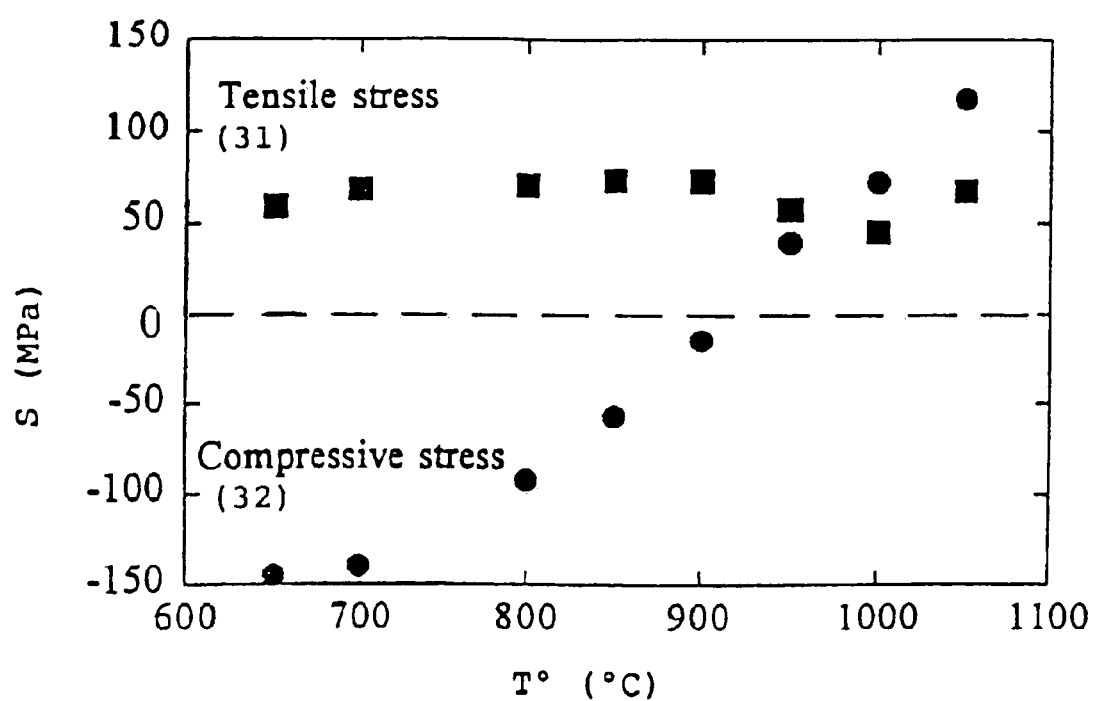
FIG. 3 represents the behaviour of stress of a polycrystalline SiGe film deposited on a carrier as a function of the annealing temperature for two different deposition pressures.

In FIG. 3, the behaviour of the stress in a poly-SiGe film having a thickness of 1.0 µm deposited onto an oxide is shown as a function of the annealing temperature.

The material grown at atmospheric pressure 32 has a relatively low compressive stress, and this stress is reduced to zero after an annealing at 900° C. for 30 minutes. For comparison, poly-Si grown by low pressure chemical vapour deposition at 620° C. exhibits an internal compressive stress larger than 300 MPa, which is annealed out at a temperature of 1050° C.

The material grown at reduced pressure 31 (lower than the atmospheric pressure e.g. 40 torrs) has a tensile internal stress, which is almost insensitive to annealing. The above observations indicate that the internal stress of poly-SiGe can be tuned by appropriate choice of growth/deposition conditions and annealing temperatures. This allows one to choose the stress of the active layer so as to compensate the one of the layers forming the infrared absorber. By this procedure, low stress and mechanically stable structures can thus be obtained. Except that in the case of an infrared absorber with very low tensile stress, this compensation procedure requires low annealing temperature or even no annealing at all.

Figure 4:
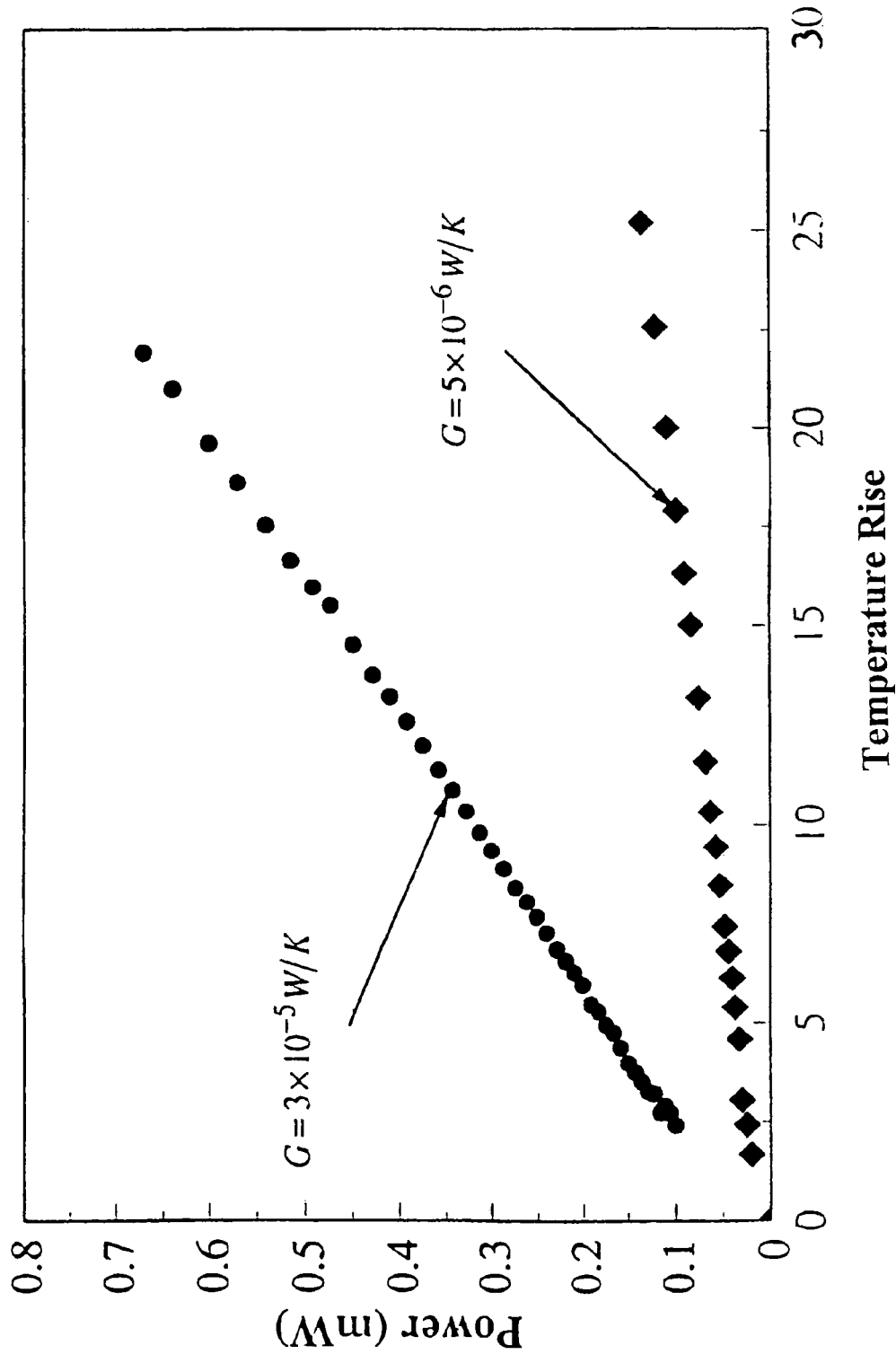
FIG. 4 represents the dependence of the power dissipated in a structure similar to the structure described in FIG. 1C on the temperature rise of the bolometer. The slope of the curve gives the thermal conductance (W/ΔT) of the bolometer, wherein the dots refer to a structure using poly-Si as active material while the small squares refers to a structure using poly-SiGe as active material according to the invention.

Furthermore, the thermal conductivity of poly-SiGe depends on the concentration of germanium atoms and has a minimum at a germanium concentration of 30%. In FIG. 4, the temperature increase ΔT obtained by dissipating the power W in a structure similar to that of FIG. 1C is reported. The dots refer to a structure made in poly-Si, the squares to a structure made of poly SiGe. The two structures are identical in shape but the thermal insulation is almost 6 times larger for poly SiGe. Using a finite element model for thermal conductivity, the values 17 W/mK and 2.5 W/mK are deduced for the thermal conductivity of the two materials. This reduction of thermal conductivity has obvious beneficial effects on the responsivity and on the noise equivalent power of the bolometer.

Electrical Properties of the Materials Used in the Bolometer of the Invention

In order to use a material for realising a bolometer, it is necessary to control by appropriate doping, both its conductivity and the dependence of conductivity on temperature. In Table I, the conductivity and the temperature coefficient of resistance are reported for different implanted doses of boron. The annealing temperature after ion implantation is also indicated.

It is possible to note that at low and medium doses, the temperature coefficient of resistance is large, as necessary for a well performing bolometer. The resistivity of highly doped material is very low. This allows one to regard the highly doped supports as conducting leads. The attention is pointed to the fact that activation of dopants is obtained also at temperatures as low as 650° C. This implies that a low thermal budget process is possible.

In conclusion, it can be stated that these properties show that poly-SiGe is a suitable material for surface micromachining applications.

DETAILED DESCRIPTION OF AN EXAMPLE ACCORDING TO A PREFERRED EMBODIMENT OF THE PRESENT INVENTION

In the following, the description is focused to the case of a sacrificial layer realised with an oxide, as represented in FIG. 1b. An example of thermal oxide can be TEOS. The process described hereafter applies with minor modification to a sacrificial layer made of porous silicon as represented in FIG. 1a.

The substrate is a silicon wafer, said substrate being already processed in order to form the appropriate CMOS switches of the infrared camera and covered with standard passivation layers.

In the following, the realisation of the bolometer is explained and no details will be given about the connection of the bolometer to the underlying electronics and to the external circuitry as they are not relevant to the present invention and can be made according to the knowledge of the man skilled in the art.

It is important to note at this stage that the preparation of bolometers using an already processed substrate is made possible by the relatively low temperature at which the bolometer is prepared.

Figure 5A:
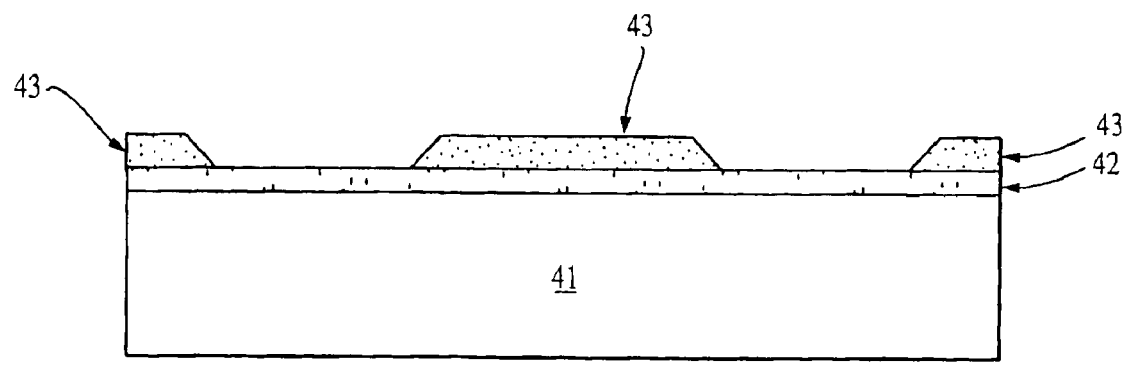
FIGS. 5a to 5f represent the side view and the top view for several steps of the fabrication process of a bolometer according to a preferred embodiment of the present invention.
Figure 5A:
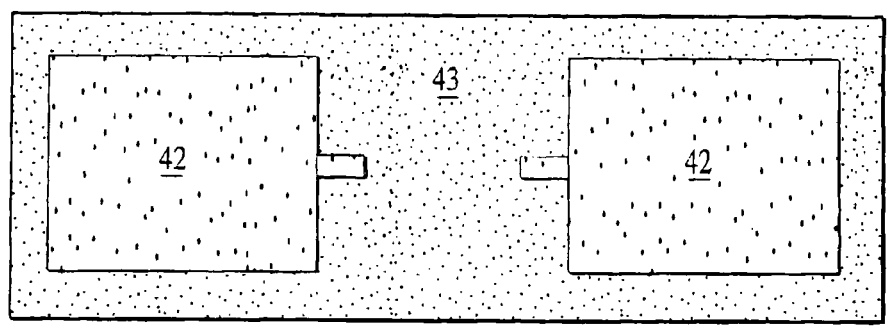

As shown in FIG. 5a, a thin layer 42 (e.g. 100 nm thick) is deposited onto the substrate 41, in order to serve as etch stop during the etching of the sacrificial layer 43. This layer 42 can be according to a first preferred embodiment a silicon-rich silicon nitride or any other material which is resistant to the etching agent of the sacrificial layer. According to another preferred embodiment, the thin layer 42 can be an undoped poly-Si layer.

The sacrificial layer 43 (1 or 2 µm of TEOS) is then deposited and patterned by standard lithography. Typical lateral dimension of the remaining TEOS regions after patterning vary from 20 µm to 50 µm.

Figure 5B:
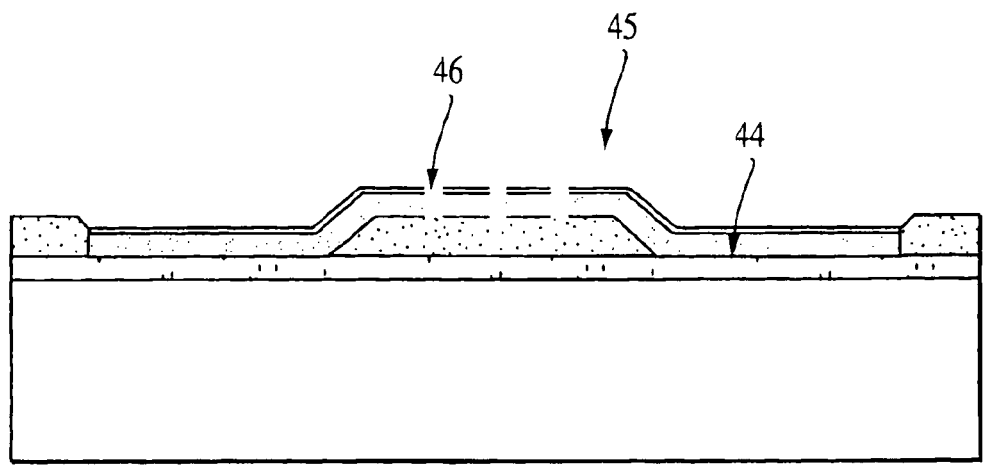
Figure 5B:
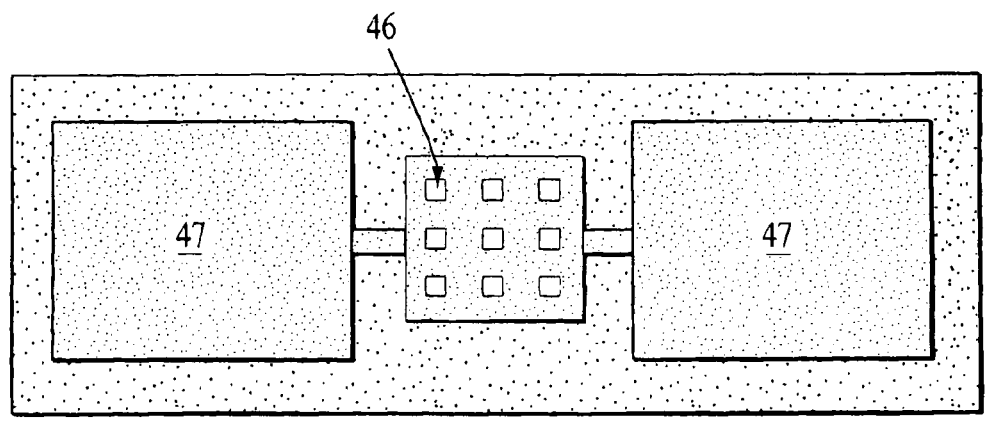

Subsequently, as represented in FIG. 5b, a poly-SiGe active layer 44 (0.5 µm or 0.3 µm thick) is established, by depositing in a chemical vapour deposition system at a temperature comprised between 600° C.–700° C. and preferably around 650° C. at atmospheric or at reduced pressure.

Gases used for the deposition are diclorosilane and germane. Their relative proportion is chosen in such a way that the concentration of germanium in the film is about 30%. This is the concentration which minimises the thermal conductivity.

Using the above process gas, the nucleation of poly-SiGe on oxides is slow, then a thin (30 Å) nucleation layer of poly-Si is used. It is also possible to use a mixture of silane and germane. In this case, no nucleation layer will be necessary.

After the poly-SiGe deposition, a thin layer of silicon nitride 45 is deposited. It will serve for electrical insulation of the absorber from the active element.

The stack of these two layers is then patterned. The holes 46 on the active layer will be useful during the sacrificial layer etching. The contacts 47 drawn in FIG. 4b are large and useful for testing single devices. When the device is inserted in a matrix their dimension can be reduced.

Figure 5C:
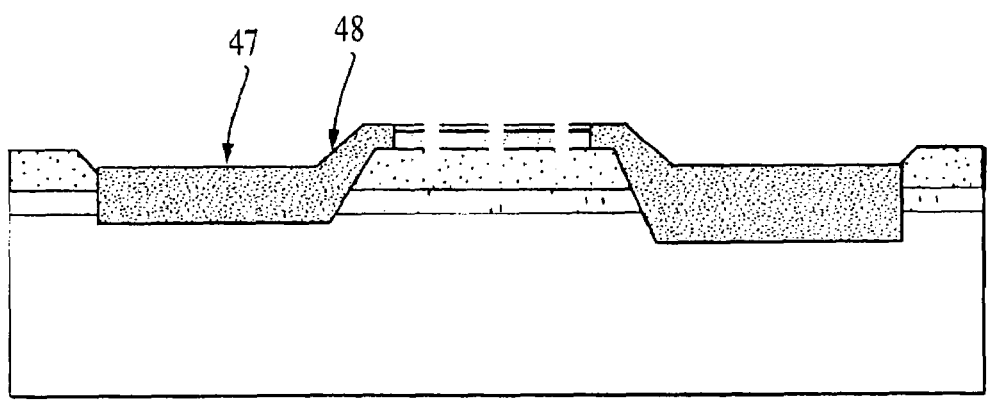
Figure 5C:
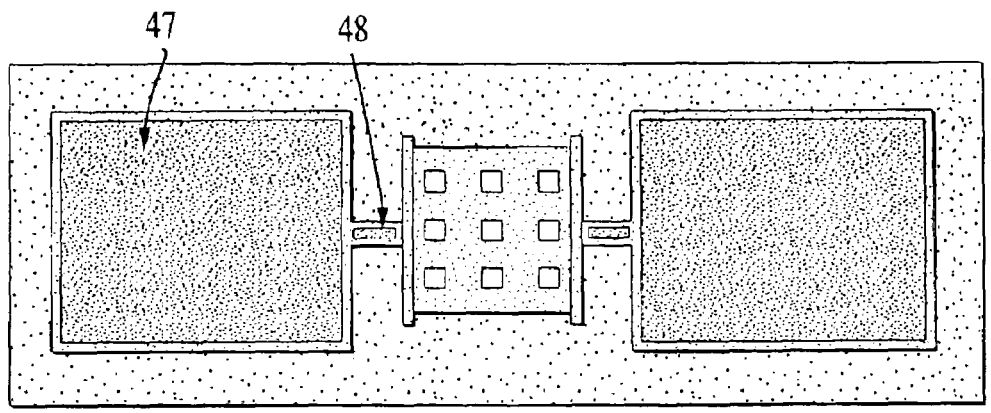

In FIG. 5c is shown that the contacts 47 and the supports 48 are implanted with a high boron dose and the active area with a moderate dose. Instead of implanting the active area by a low doping dose, it is also possible to dope it at a desired level during the deposition of poly-SiGe by adding appropriate gases to diclorosilane and germane. An annealing for dopant activation and diffusion is performed. By means of the above dopings, the supports act as electrical contacts and the conductivity and the TCR of the active area is tuned to the desired value.

Figure 5D:
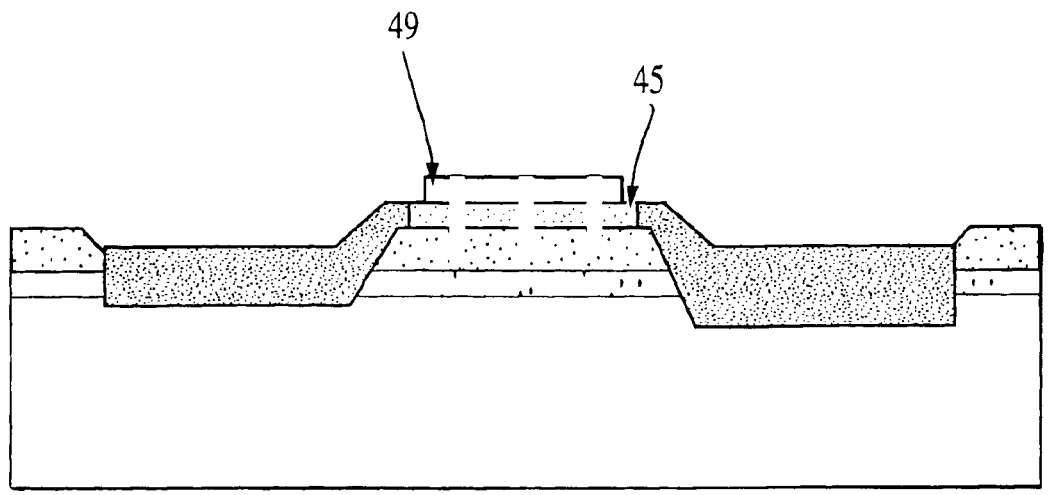
Figure 5D:
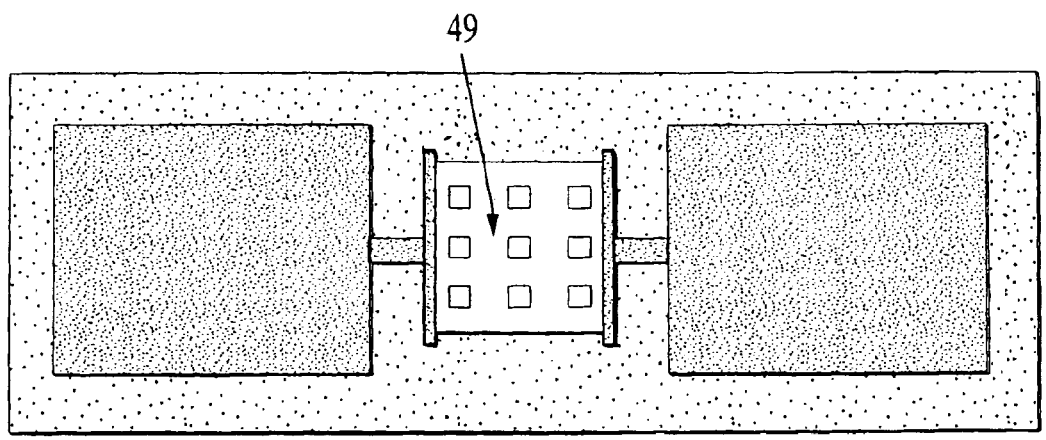
Figure 5E:
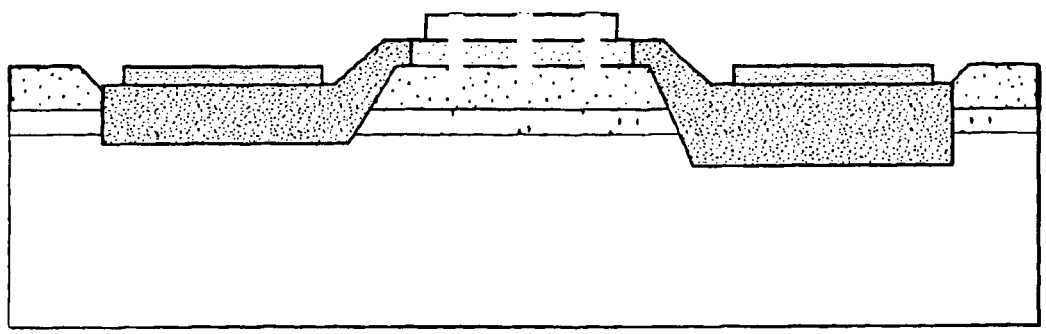
Figure 5E:
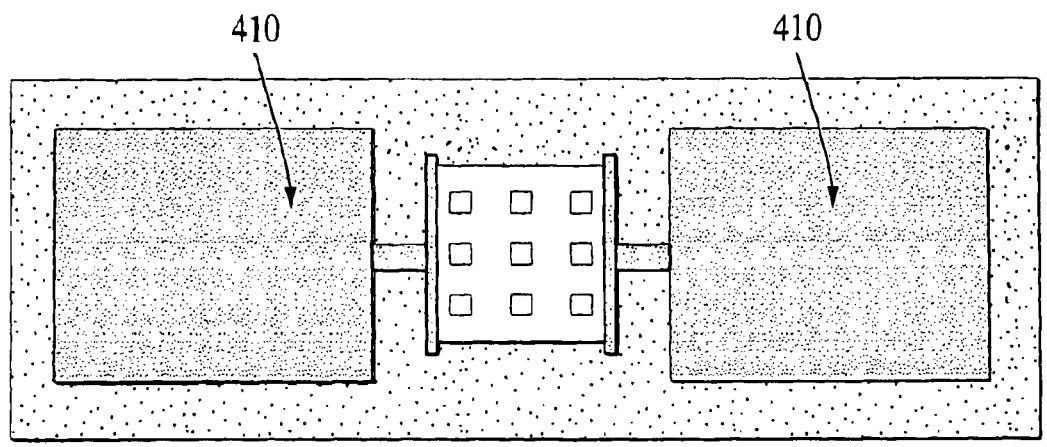

The construction of the bolometer proceeds by the deposition and patterning of the absorber 49 as represented in FIG. 5d. At this stage, either vias to the underlying electronics are opened or metal contact 410 are deposited for test purposes (see FIG. 5e).

Figure 5F:
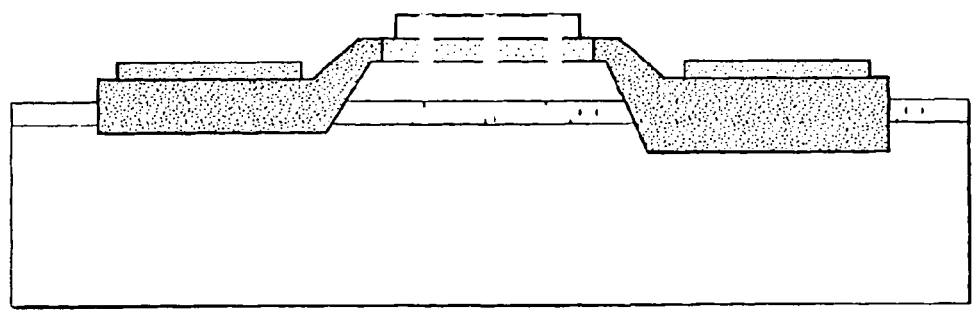
Figure 5F:
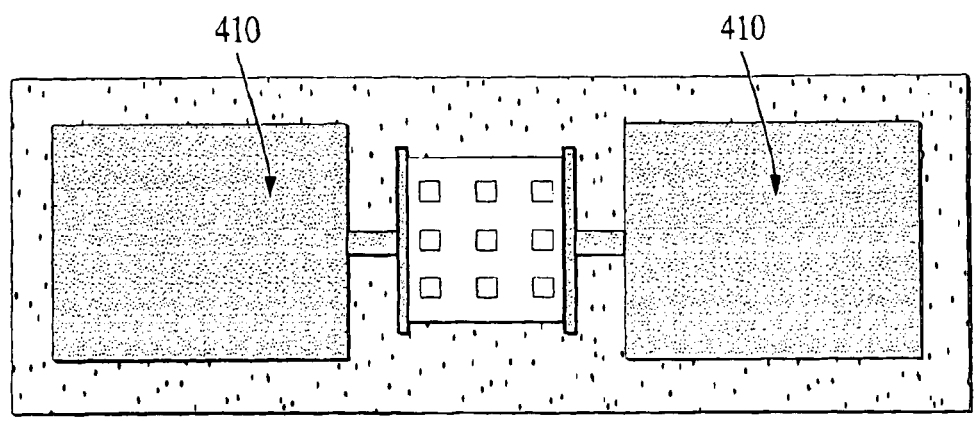

The construction of the bolometer is completed by the removal of the sacrificial layer using standard micro machining techniques (see FIG. 5f). The absorber can be composed, for example, of a triple layer: starting from the silicon nitride, a metal reflector, an insulating layer about 1.5 µm thick, and a semitransparent metal are formed. Other possibilities for preparing the absorber exists and can be used.

Another absorber can be made as follows: an infrared absorber having a Ti layer of 0.2 µm thick, a polyimide (Hitachi polyimide) layer of 1.4 µm thick and a semitransparent NiCr layer having a thickness of 5 nm is suggested.

The Ti layer can be up to 1 µm thick in order to have better reflector properties. However, if the thickness of this Ti layer is too large, the stress will also be too high and the device will crack.

The thickness of the polyimide define the wavelength maximal absorption. This means that if the thickness changes, the wavelength will also change.

The formula $$T = \frac{\lambda}{4n}$$

is determining, wherein according to this example, $\lambda=10$ µm and $n=1.8$ which will give a thickness of 1.4 µm.

The NiCr layer can have a thickness of 2 to 5 or 10 nm or even more. For instance, for $\lambda=10$ µm, a thickness of 5 nm will give 100% absorbance which corresponds to the conditions for destructive interference.

Figure 6B:
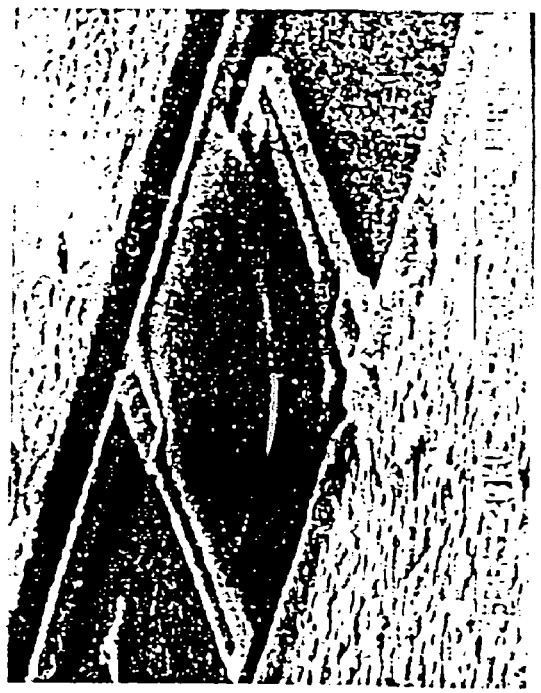
FIGS. 6a & 6b show SEM pictures of two micromachined bolometers according to several embodiments of the invention having lateral dimensions of 50 μm(a) and 25 μm(b) respectively and wherein the thickness of the poly SiGe layer is 1 μm, the width of the supports is 5 μm and 0.6 μm for the 50×50 μm(a) bolometer(s) and the 25×25 μm(b) bolometer respectively.
Figure 6A:

In FIG. 6, SEM pictures of two micromachined bolometers are represented. These bolometers have lateral dimensions of 50 µm and 25 µm respectively with a thickness of the poly SiGe layer of 1 µm. For the small devices, the support width is only 0.6 µm, and the thermal conductance in vacuum is only $10^{-7}$ W/K.

Figure 7:
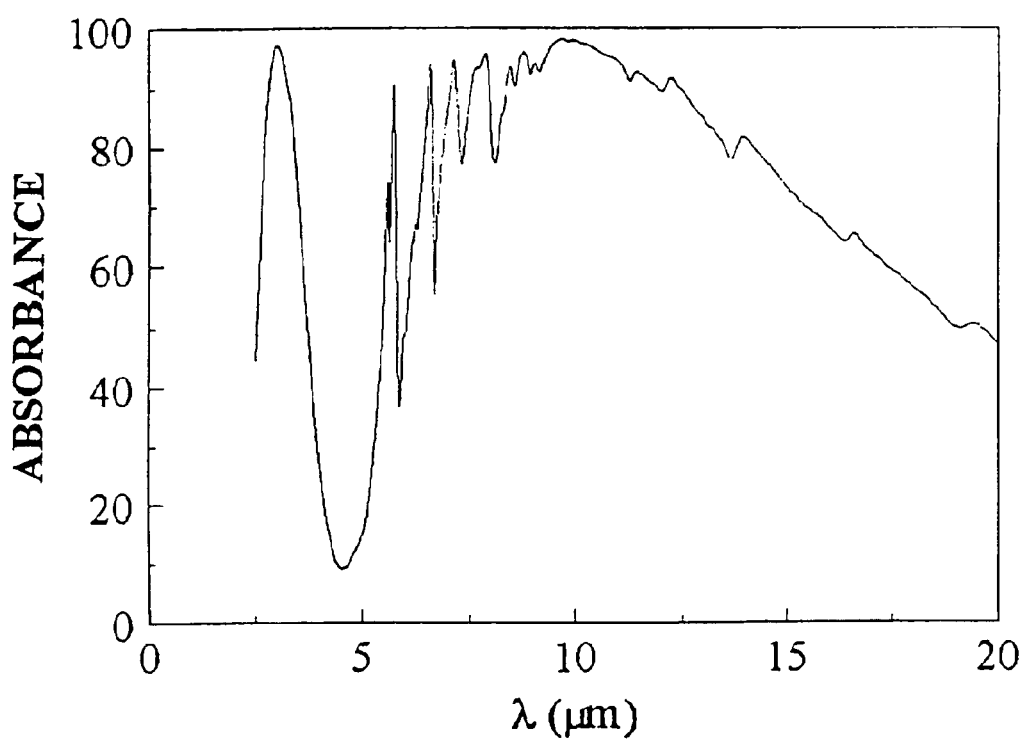
FIG. 7 displays the experimentally measured absorbance of an infrared absorber used in one embodiment of the invention, versus the wavelength of the radiation.

In FIG. 7, the absorbance of the infrared absorber as a function of the wavelength is represented, it is shown that an absorbance of 0.7 can be obtained in the 8–14 µm region.

Figure 8:
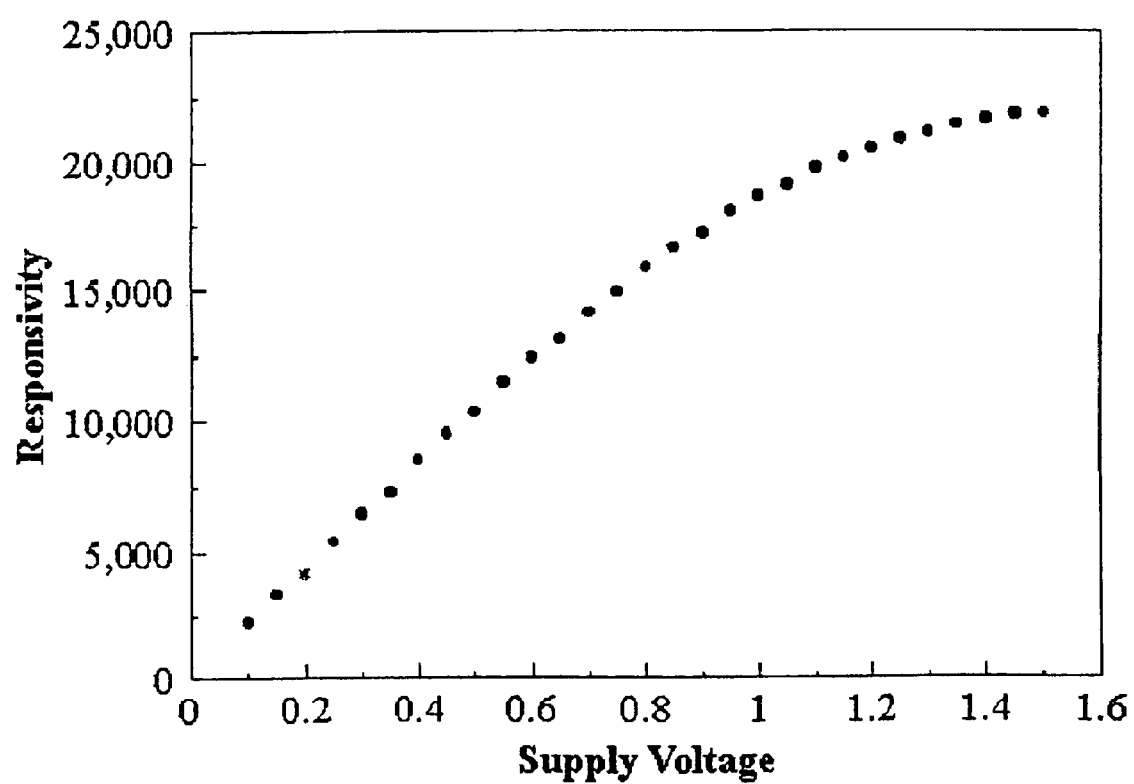
FIG. 8 represents the experimentally measured responsivity ℜ as a function of the supply voltage of a bolometer fabricated according to the invention and wherein the responsivity is expressed in Volt/Watt and represents the voltage generated per unit of power incident in the bolometer.

In FIG. 8, the responsivity measured as a function of the applied dc bias voltage is reported. Considering that in camera operation, pulsed bias is used, and the voltage can be increased up to 5 V, responsivities in excess of $10^5$ V/W can be obtained.

Figure 9:
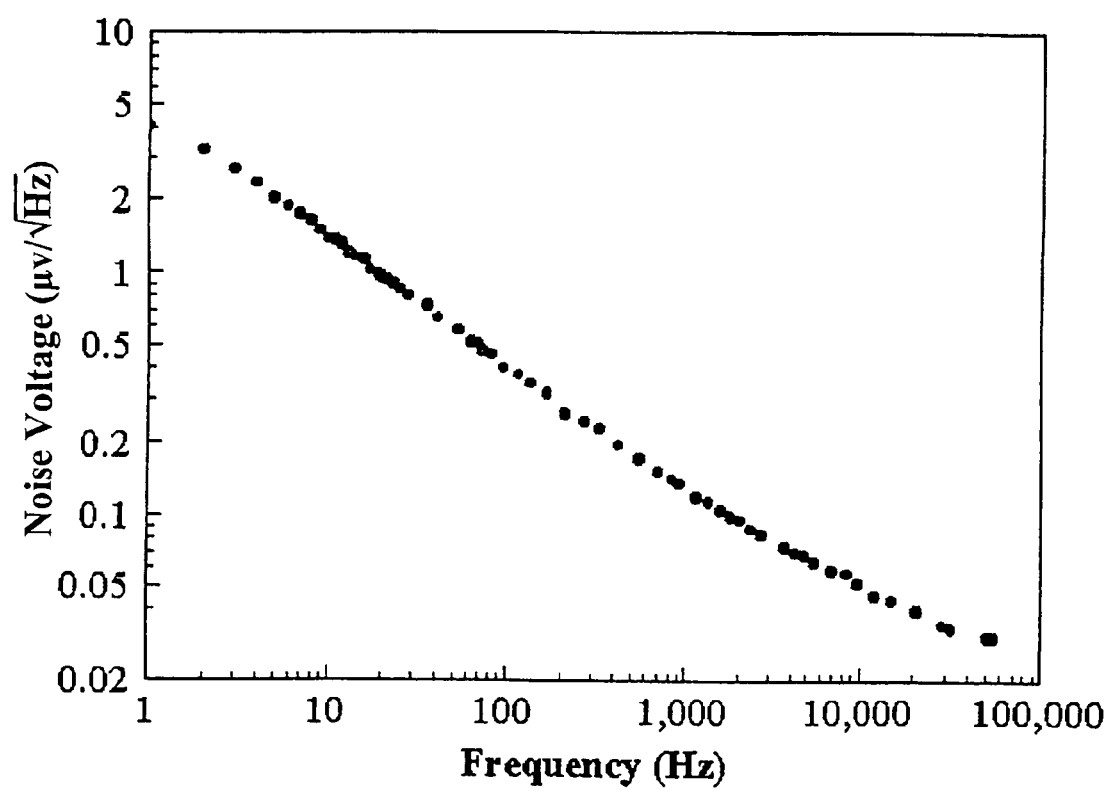
FIG. 9 displays the measured frequency dependence of the total noise of a bolometer according to one embodiment of the invention as shown in FIG. 6b over the range extending from 1 Hz to 100 KHz.

In FIG. 9, the bolometer noise as a function of frequency is reported. A frequency independent detectivity cannot be defined. Having in mind infrared camera application, considering a frequency bandwidth extending from 10 to 100000 Hz, the average noise and detectivity in this range can be computed.

It is intended that the foregoing detailed description be regarded as illustrative rather than limiting and that it is understood that the following claims, including all equivalents, are intended to define the scope of the invention.

TABLE I

Values of resistivity and temperature coefficient of resistance for different implanted doses of boron and for different annealing temperature.

| Dose | Resistivity | | α |
|---|---|---|---|
| | $T_{ann} = 650$ °C. | $T_{ann} = 850$ °C. | $T_{ann} = 850$ °C. |
| $5\ 10^{12}$ (B/cm²) | — | 400 Ωcm | −4.3% |
| $3\ 10^{13}$ (B/cm²) | 21 Ωcm | 30 Ωcm | −2.0% |
| $10^{16}$ (B/cm²) | $7\ 10^{-3}$ Ωcm | $3\ 10^{-3}$ Ωcm | — |

We claim:

1. A method of controlling an internal stress in a polycrystalline silicon-germanium layer deposited on a substrate, the method comprising:
   selecting a range for the internal stress in the silicon germanium layer;
   selecting a deposition pressure that is at or below atmospheric pressure; and
   selecting a deposition temperature that is no greater than 700° C.;
   wherein the deposition pressure and the deposition temperature are selected such that the internal stress in the silicon-germanium layer is within the selected range.

2. The method of claim 1, wherein the deposition pressure is approximately 40 torrs.

3. The method of claim 1, further comprising modifying the deposition temperature.

4. The method of claim 3, wherein the deposition temperature is between 600° C. and 700° C.

5. The method of claim 3 wherein the deposition temperature is approximately 650° C.

6. A method of depositing a silicon-germanium layer, the method comprising:
   depositing a sacrificial layer on a substrate;
   depositing a silicon-germanium layer on said sacrificial layer using chemical vapor deposition; and
   removing at least a portion of said sacrificial layer from under said silicon-germanium layer such that a structural layer of a microelectromechanical device is formed from the silicon-germanium layer.

7. The method of claim 6, wherein the sacrificial layer comprises an oxide layer.

8. The method of claim 7, wherein the oxide layer comprises a silicon-oxide layer.

9. The method of claim 7, wherein the silicon-oxide layer comprises a thermal oxide.

10. The method of claim 6, wherein the silicon-germanium layer is deposited at a deposition temperature between 600° C. and 700° C.

11. The method of claim 10, wherein the deposition temperature is approximately 650° C.

12. The method of claim 10, wherein the silicon-germanium layer is deposited at atmospheric pressure.

13. The method of claim 10, wherein the silicon germanium layer is deposited at a pressure below atmospheric pressure.

14. The method of claim 6, wherein a deposition pressure and a deposition temperature for the silicon-germanium layer are selected so as to achieve an internal stress in the silicon-germanium layer that is within a predetermined range.

15. A method of depositing a silicon-germanium layer, the method comprising:
   depositing a sacrificial layer on a substrate;
   depositing a silicon-germanium layer on said sacrificial layer at a deposition temperature of no more than 700° C.; and
   removing at least a portion of said sacrificial layer from under said silicon-germanium layer such that a structural layer of a microelectromechanical device is formed from the silicon-germanium layer.

16. The method of claim 15, wherein the sacrificial layer comprises an oxide layer.

17. The method of claim 15, wherein the deposition temperature is approximately 650° C.

18. The method of claim 15, wherein the silicon-germanium layer is deposited at atmospheric pressure.

19. The method of claim 15, wherein the silicon germanium layer is deposited at a pressure below atmospheric pressure.

20. The method of claim 15, wherein the deposition temperature and a deposition pressure for the silicon-germanium layer are selected so as to achieve an internal stress in the silicon-germanium layer that is within a selected predetermined range.

* * * * *